United States Patent
Aflatouni et al.

(10) Patent No.: US 9,935,712 B2
(45) Date of Patent: Apr. 3, 2018

(54) OPTICALLY BALANCED OPTO-ELECTRICAL OSCILLATOR

(71) Applicant: California Institute of Technology, Pasadena, CA (US)

(72) Inventors: Firooz Aflatouni, Pasadena, CA (US); Behrooz Abiri, Pasadena, CA (US); Seyed Ali Hajimiri, La Canada, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 0 days.

(21) Appl. No.: 14/027,129

(22) Filed: Sep. 13, 2013

(65) Prior Publication Data

US 2015/0078754 A1 Mar. 19, 2015

Related U.S. Application Data

(60) Provisional application No. 61/700,773, filed on Sep. 13, 2012.

(51) Int. Cl.
*H04B 10/2575* (2013.01)
*H03K 3/42* (2006.01)
*G02F 1/21* (2006.01)

(52) U.S. Cl.
CPC .......... *H04B 10/2575* (2013.01); *H03K 3/42* (2013.01); *G02F 2001/212* (2013.01)

(58) Field of Classification Search
CPC .. H04B 10/2575; G02F 2001/212; H03K 3/42
(Continued)

(56) References Cited

U.S. PATENT DOCUMENTS 6,867,904 B2 * 3/2005 Ng ................. H01S 5/4006
359/332
6,879,433 B1 4/2005 Yamashita et al.
(Continued)

FOREIGN PATENT DOCUMENTS

| JP | 2005-164968 A | 6/2005 |
| WO | 2014/043590 A1 | 3/2014 |

OTHER PUBLICATIONS

International Search Report and Written Opinion for PCT Application No. PCT/US2013/059827 dated Dec. 19, 2013.
(Continued)

*Primary Examiner* — David Payne
*Assistant Examiner* — Omar S Ismail
(74) *Attorney, Agent, or Firm* — Alston & Bird LLP (57) ABSTRACT

An opto-electrical oscillator includes, in part, first and second optical phase modulators, a coupler, an optical-to-electrical signal conversion circuit, and a control circuit. The first optical phase modulator modulates the phase of a first optical signal in response to a first feedback signal to generate a first phase modulated signal. The second optical phase modulator modulates the phase of a second optical signal in response to a second feedback signal to generate a second phase modulated signal. The first and second optical signals travel through first and second optical paths respectively and are generated from the same optical source. The optical-to-electrical signal conversion circuit receives an optical signal from the coupler and in response generates an electrical signal applied to the control circuit. The output signals of the control circuit cause the first and second feedback signals to be out of phase.

19 Claims, 4 Drawing Sheets

(58) Field of Classification Search
USPC ....... 398/188, 162, 163, 116, 195, 203, 204, 398/206, 209
See application file for complete search history.

(56) References Cited

U.S. PATENT DOCUMENTS

| | | | | |
|---|---|---|---|---|
| 8,023,831 B1* | 9/2011 | Hayes | ................... | H04B 10/50 398/140 |
| 2002/0003641 A1* | 1/2002 | Hall | ................... | H04B 10/532 398/65 |
| 2002/0131662 A1 | 9/2002 | Strutz et al. | | |
| 2003/0021509 A1* | 1/2003 | Yap | ................... | G02F 1/3136 385/3 |
| 2004/0100682 A1 | 5/2004 | Fujiwara et al. | | |
| 2005/0286911 A1* | 12/2005 | Doerr | ................... | H04B 10/69 398/214 |
| 2008/0001062 A1 | 1/2008 | Gunn et al. | | |
| 2008/0191313 A1* | 8/2008 | Rofougaran | ......... | H03B 21/01 257/532 |
| 2009/0317075 A1* | 12/2009 | Mandai | ................ | H04B 10/60 398/25 |
| 2010/0156549 A1* | 6/2010 | Uemura | .............. | H03B 5/1243 331/167 |
| 2011/0006825 A1* | 1/2011 | Fludger | ................ | H04B 10/677 327/243 |
| 2011/0026935 A1* | 2/2011 | Akiyama | .......... | H04B 10/5053 398/184 |
| 2012/0212360 A1* | 8/2012 | Kanter | ..................... | G02F 7/00 341/120 |

OTHER PUBLICATIONS

Yao, et al., "Optoelectronic microwave oscillator," *J. Opt. Soc. Am. B*, 13(8):1725-1735, (1996).

Aflatouni, et al., "Design Methodology and Architectures to Reduce the Semiconductor Laser Phase Noise Using Electrical Feedforward Schemes," *IEEE Transactions on Microwave Theory and Techniques*, 58(11):3290-3303, (2010).

PCT International Preliminary Report on Patentability for application PCT/US2013/059827 dated Mar. 17, 2015.

* cited by examiner

OPTICALLY BALANCED OPTO-ELECTRICAL OSCILLATOR

CROSS-REFERENCES TO RELATED APPLICATIONS

The present application claims benefit under 35 USC 119 (e) of U.S. provisional application No. 61/700,773, filed Sep. 13, 2012, entitled "Optically Balanced Opto-Electrical Oscillators", the content of which is incorporated herein by reference in its entirety.

BACKGROUND OF THE INVENTION

Figure 1:
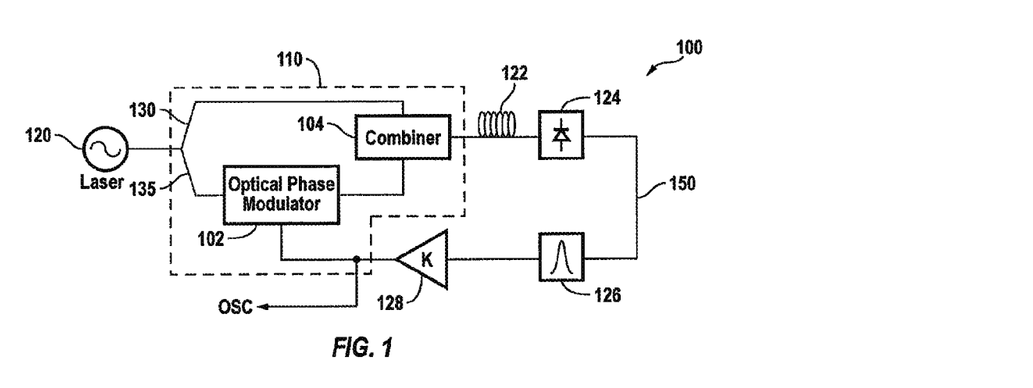
FIG. 1 is a simplified block diagram of an opto-electronic oscillator, as known in the prior art.

Oscillators are commonly used in electronic and optical systems to generate an oscillating signal for a wide variety of applications. For example, low phase-noise oscillators, such as opto-electronic oscillators, are used in wireless communication, sensing, spectroscopy, high resolution imaging units, and high resolution radars. FIG. 1 is a simplified block diagram of an opto-electronic oscillator 100, as known in the prior art. Opto-electronic oscillator 100 is shown as including, a laser 120, a Mach-Zehnder modulator (MZM) 110, a delay line 122, a photo-diode 124, a filter 126, and an amplifier 128. The output of amplifier 128 is an oscillating signal OSC and applied as a feedback signal to phase modulator 102 disposed in MZM 110.

The signal generated by laser 120 is delivered to both optical paths 130 and 135 of MZM 110. The optical signal travelling in path 135 is phase modulated by phase modulator 102 and combined by combiner 104 with the optical signal travelling in path 130. In the following, for simplicity, an optical path and the optical signal travelling through that path may be identified using the same reference number. For example, optical path 130 may be alternatively referred to as optical signal 130. If the output signal of phase modulator 102 and optical signal 130 are in phase, combiner 104 causes a constructive interferences of these two signals, thereby to generate a high-level signal at its output. If, on the other hand, the output signal of phase modulator 102 and optical signal 130 are 90 degrees out-of-phase, combiner 104 causes a destructive interferences of these two signals, thereby to generate a low-level signal at its output.

The longer the time delay caused by delay line 122, the smaller is the phase noise. Accordingly, the delay across delay line 122 and the filter characteristics of filter 126 are designed so as to achieve the required level of phase noise and the oscillation frequency. Photo-diode 124 is adapted to convert the optical signal it receives from delay line 122 to an electrical signal. This electrical signal is subsequently filtered by filter 126 and amplified by amplifier 128. The output of amplifier 128 is used a feedback signal to vary the phase of optical signal 135 and provide the oscillation.

Figure 2:
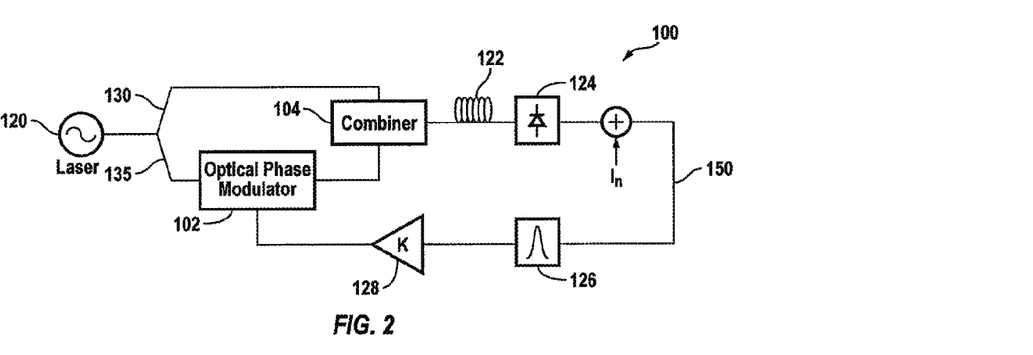
FIG. 2 shows the noise contribution from different noise sources in the opto-electronic oscillator of FIG. 1.

The noise contribution from different sources in oscillator 100 may be modeled as an electrical noise current $I_n$ injected into path 150—which connects photodiode 124 and filter 126, as shown in FIG. 2. The total noise contribution may be defined as following:

$$\overline{i_{n,total}^2} = \overline{i_{n,electrical}^2} + \overline{i_{n,Laser,RIN}^2} + \overline{i_{n,Photodiode,shot}^2} \tag{1}$$

In the above expression (1) $i_{n,electrical}$ represents the total input-referred current noise associated with all the electronic blocks, $i_{n,Laser,RIN}$ represents the equivalent current noise associated with the laser's relative intensity noise (RIN), and $i_{n,Photodiode,shot}$ represents the photodiode shot noise. For oscillator 100, the −3 dB linewidth of the power spectral density of the generated electrical oscillatory voltage is defined by:

$$C_e \approx \frac{\overline{i_{n,total}^2}}{2R^2 P_0^2 \tau^2 J_1^2\left(\frac{V_o}{V_\pi}\pi\right)} \tag{2}$$

In the above expression (2), parameters R, $P_0$, τ, $V_o$, and $V_\pi$ respectively represent the photodiode responsivity, the laser power, the delay of the optical delay line, the oscillation amplitude, and the modulator voltage to phase gain, respectively. Also, J (.) represents the Bessel function of the first kind.

Using a typical semiconductor laser in an opto-electronic oscillator, usually the largest noise contribution comes from the laser amplitude noise. As an example and referring to FIG. 1, for a laser with RIN of −130 dB/Hz, photodiode responsivity R≈1A/W, laser power $P_0$=1 mW, and total electrical noise figure of 3 dB, noise parameter $i_{n,Laser,RIN}$ which is defined by $RP_0\sqrt{RIN}$ is approximately equal to 316 pA/√Hz for this example. The equivalent noise associated with the laser is thus an order of magnitude greater than the input referred current noise of electrical circuitry, $i_{n,electrical}$, which for a 3 dB noise figure in a 50Ω system is approximately equal to 17 pA/√Hz in the above example. As shown with this example, reducing the laser RIN significantly reduces the phase noise of an opto-electronic oscillator.

BRIEF SUMMARY OF THE INVENTION

An opto-electrical oscillator, in accordance with one embodiment of the present invention, includes, in part, first and second optical phase modulators, a coupler, first and second optical-to-electrical signal converters, and a control circuit. The first optical phase modulator is adapted to modulate the phase of a first optical signal in response to a first feedback signal to generate a first phase modulated signal. The first optical signal travels through a first optical path. The second optical phase modulator is adapted to modulate the phase of a second optical signal in response to a second feedback signal to generate a second phase modulated signal. The second optical signal travels through a second optical path. The coupler has first and second input ports that receive the first and second phase modulated signals. The first optical-to-electrical signal converter is adapted to receive an optical signal from a first output port of the coupler. The second optical-to-electrical signal converter is adapted to receive an optical signal from a second output port of the coupler. The control circuit causes the first and second feedback signals to be out of phase in response to an output signal of the first and second optical-to-electrical signal converters.

In one embodiment, the opto-electrical oscillator further includes, in part, a first optical delay line coupled between the first optical phase modulator and the coupler, and a second optical delay line coupled between the second optical phase modulator and the coupler. In one embodiment, the first and second optical delay lines generate the same delay. In one embodiment, the opto-electrical oscillator further includes, in part a first optical delay line coupled between the first optical-to-electrical signal converter and the coupler, and a second optical delay line coupled between the second optical-to-electrical signal converter and the coupler. In yet another embodiment, the opto-electrical oscillator further includes, in part, a first optical delay line coupled between the first optical phase modulator and the coupler, a second optical delay line coupled between the second optical phase modulator and the coupler, a third optical delay line coupled between the first optical-to-electrical signal converter and the coupler, and a fourth optical delay line coupled between the second optical-to-electrical signal converter and the coupler.

In one embodiment, the opto-electrical oscillator further includes, in part, a first filter responsive to a first output terminal of the control circuit, a first amplification stage adapted to generate the first feedback signal in response to the first filter, a second filter responsive to a second output terminal of the control circuit, and a second amplification stage adapted to generate the second feedback signal in response to the second filter.

In one embodiment, the opto-electrical oscillator further includes, in part, a filter responsive to output signals of the first and second optical-to-electrical signal converters, and an amplification stage adapted to amplify an output signal of the filter. The control circuit supplies the first and second feedback signals in response to the output signal of the amplifier. In one embodiment, the control circuit is a single-ended to a differential pair signal converter. In one embodiment, the single-ended to the differential pair signal converter is a Balun. In one embodiment, the control circuit is further adapted to cause the first and second feedback signals to be out of phase by substantially 180 degrees.

In one embodiment, the control circuit is further adapted to cause the first and second feedback signals to change the phase of the first optical signal travelling through the first path relative to the phase of the second optical signal travelling through the second path by 90 degrees if the first optical-to-electrical signal converter generates a current and the second optical-to-electrical signal converter does not generate a current. In such embodiments, the control circuit is further adapted to cause the first and second feedback signals to change the phase of the first optical signal travelling through the first path relative to the phase of the second optical signal travelling through the second path by −90 degrees if the first optical-to-electrical signal converter does not generate a current and the second optical-to-electrical converter generates a current.

A method of generating an oscillating signal, in accordance with one embodiment of the present invention, includes in part, modulating the phase of a first optical signal travelling through a first optical path in response to a first feedback signal to generate a first phase modulated signal, modulating the phase of a second optical signal travelling through a second optical path in response to a second feedback signal to generate a second phase modulated signal, supplying the first and second phase modulated signals to a coupler, converting the output signal of the coupler to an electrical signal, and causing the first and second feedback signals to be out of phase in response to the electrical signal.

In one embodiment the method further includes, in part, delaying the first and second phase modulated optical signals. In one embodiment, the delay of the first and second phase modulated signals are substantially similar. In one embodiment the method further includes, in part, delaying the output signal of the coupler. In yet another embodiment, the method further includes, delaying the first and second phase modulated optical signals, and delaying the output signal of the coupler.

In one embodiment, the method further includes, in part, filtering a first signal generated in response to the electrical signal, amplifying the first filtered signal to generate the first feedback signal, filtering a second signal generated in response to the electrical signal, and amplifying the second filtered signal to generate the second feedback signal. In yet another embodiment, the method further includes, filtering the electrical signal to generate a filtered signal, and generating the first and second feedback in response to the filtered signal.

In one embodiment, the method further includes, in part, converting the electrical signal to a pair of differential signals. In one embodiment, the electrical signal is converted to a pair of differential signals using a Balun. In one embodiment, the first and second feedback signals are caused to be out of phase by substantially 180 degrees.

DETAILED DESCRIPTION OF THE INVENTION

Figure 3:
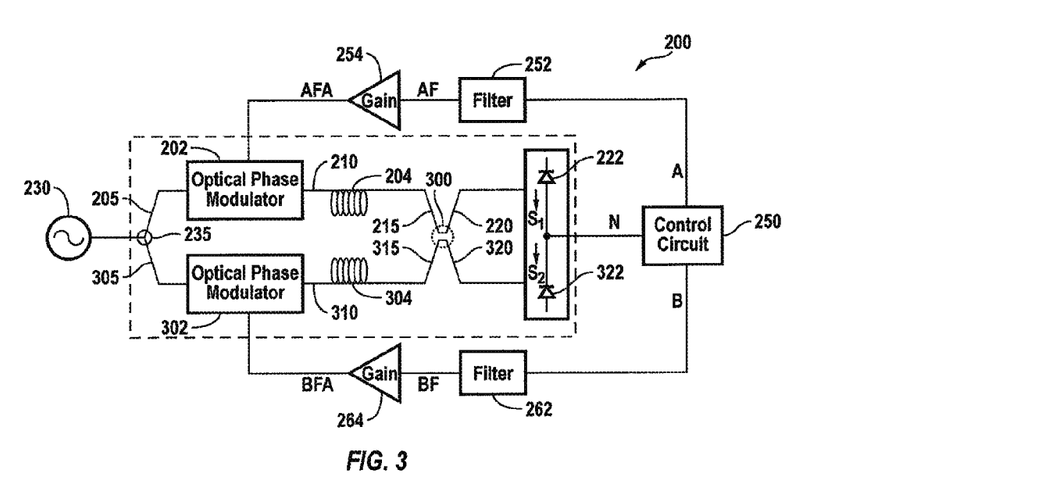
FIG. 3 is a simplified block diagram of an opto-electronic oscillator, in accordance with one embodiment of the present invention.

FIG. 3 is a simplified block diagram of an opto-electronic oscillator 200, in accordance with one embodiment of the present invention. Opto-electronic oscillator 200 is shows as including, in part, a pair of balanced optical signal processing paths. The first optical signal processing path is shown as including paths 205, 210, 215, 220, and phase modulator 202. The second optical signal processing path is shown as including paths 305, 310, 315, 320, and phase modulator 302.

Optical path 205 delivers the optical signal it receives from optical source 230 (via splitter 235) to optical phase modulator 202. The optical signal modulated by phase modulator 202 is delayed by delay line 204 and delivered to coupler 300 via optical path 215. Similarly, optical path 305 delivers the optical signal it receives from optical source 230

(via splitter 235) to optical phase modulator 302. The optical signal modulated by phase modulator 302 is delayed by delay line 304 and delivered to coupler 300 via optical path 315. Coupler 300 has two input terminals 215, 315, and two output terminals 220, 320. Coupler 300 is adapted to distribute the optical signals it receives from paths 215, 315 to paths 220, 320 in accordance with the relative phases of the two signals travelling in paths 215, 315, and as described further below.

In the following, for simplicity, an optical path and the optical signal travelling through that path may be identified using the same reference number. For example, optical path 205 may be referred to as such, or may be alternatively referred to as optical signal 130. Opto-electronic oscillator is also shown as including, in part, a control circuit 250, a first optical-to-electrical signal converter 222 adapted to convert the optical signal it receives via path 220 to a first electrical signal $S_1$, and a second optical-to-electrical signal converter 322 adapted to convert the optical signal it receives via path 320 to a second electrical signal $S_2$. First and second optical-to-electrical signal converter 222, and 322 together form an optical-to-electrical signal conversion circuit 225, as shown. In one embodiment, optical-to-electrical signal converters 222 and 322 are photodiodes.

Opto-electronic oscillator 200 is also shown as including, in part, a control circuit 250, first and second filters 252, 262, and first and second amplification stages 254, 264. Control circuit 250 has an input terminal that receives the output signal of optical-to-electrical signal conversion circuit 225 at node N, and in response, generates a pair of output signals A and B. Control circuit 250 together with filter 252 and amplification stage 254 form a first feedback loop so as to generate a first feedback signal AFA that is applied to phase modulator 202. Likewise, control circuit 250 together with filter 262 and amplification stage 264 form a second feedback loop so as to generate a second feedback signal BFA that is applied to phase modulator 302. Filter 252 filters out the frequency components of signal A that are outside a predefined range to generate a filtered signal AF. Amplification stage 254 amplifies signal AF to generate signal AFA. Likewise, filter 262 filters out the frequency components of signal B that are outside a predefined range to generate filtered signal BF. Amplification stage 264 amplifies signal BF to generate signal BFA.

Figure 4A:
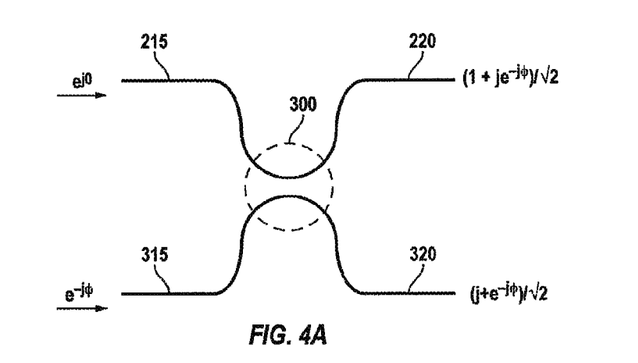
FIG. 4A shows relative phases of input and output signals of the coupler disposed in opto-electronic oscillator of FIG. 3, in accordance with one embodiment of the present invention.

To provide oscillation, optical phase modulators 202 and 302 vary the relative phases of the optical signals they deliver to optical paths (hereinafter alternatively referred to as paths) 210, 310 in response to feedback signals AFA and BFA respectively. Exemplary FIG. 4A shows that the signal delivered to path 315 has a phase shift of Ø degrees relative to the phase of the signal delivered to path 215. Accordingly, coupler 300 delivers a signal to path 220 whose phase is defined by $(1+je^{-j\emptyset})/\sqrt{2}$, and a signal to path 320 whose phase is defined by $(j+je^{-j\emptyset})/\sqrt{2}$. Plots 280 and 290 of FIG. 4B are computer simulations respectively showing the power of the signals delivered to paths 220 and 320 by coupler 300 as a function of the phase shift Ø of the optical signals received by paths 215 and 315.

Figure 4B:
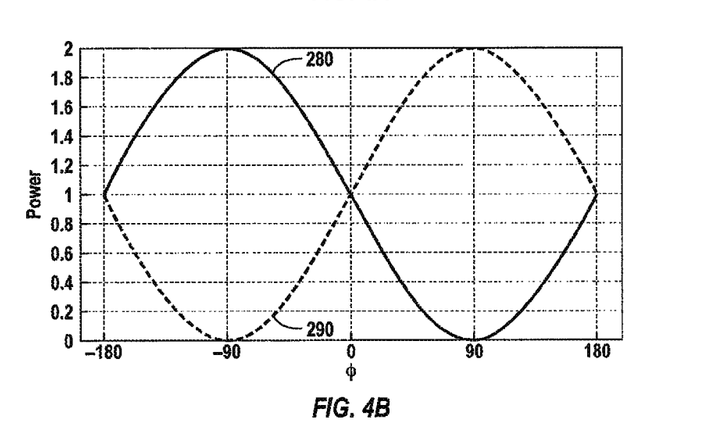
FIG. 4B is a computer simulation of the power of the output signals of the coupler as a function of the phase different between the input signals of the coupler disposed in opto-electronic oscillator of FIG. 3, in accordance with one embodiment of the present invention.

Referring to FIGS. 3 and 4B concurrently, assume that during cycle $T_1$, signal 315 lags signal 215 by 90 degrees (i.e, Ø is minus 90). Accordingly, nearly all of the optical signal received by coupler 300 is delivered to path 220 and substantially none of the optical signal is delivered to path 320. In response, optical-to-electrical signal converter 222 generates a current $S_1$ that is delivered to control circuit 250.

During the subsequent cycle $T_2$, signal AFA modulates the phase of the optical signal 205 (using phase modulator 202), and signal BFA modulates the phase of the optical signal 305 (using phase modulator 302) so as to cause optical signal 210 to lag optical signal 310 by 90 degrees. Accordingly, during cycle $T_2$, nearly all of the optical signal received by coupler 300 (from paths 215 and 315) is delivered to path 320 and substantially none of the optical signal is delivered to path 220. In response, optical-to-electrical signal converter 322 generates a current $S_2$. Therefore current signals $S_1$ and $S_2$ remain out of phase by substantially 180 degrees. Since the output signal of the optical-to-electrical conversion circuit 225 (applied to its output node/terminal N) is defined by the difference between currents $S_1$ and $S_2$, the desired signals represented by currents $S_1$ and $S_2$ are added together. Furthermore, the noise component of the signal generated by the optical source 230 gets rejected in the process of subtracting signal $S_1$ from $S_2$. As is known, coupler 300 introduces a 90 degrees phase shift across its two output terminals. Control circuit 250 is adapted to vary the relationship between the phases of its input and output signals such that output signals A and B are out of phase.

Since an opto-electrical oscillator in accordance with the present invention is balanced, any noise in the amplitude of optical source 30 (which in one embodiment may be a laser) is significantly reduced. In other words, because the amplitude noise of optical source 30 is coupled to both optical-to-electrical signal converter 222 (which is adapted to source current) and 322 (which is adapted to sink current), an opto-electrical oscillator 200, in accordance with embodiments of the present invention, has a relatively high common mode rejection ratio and therefore relatively high immunity to noise.

Figure 5:
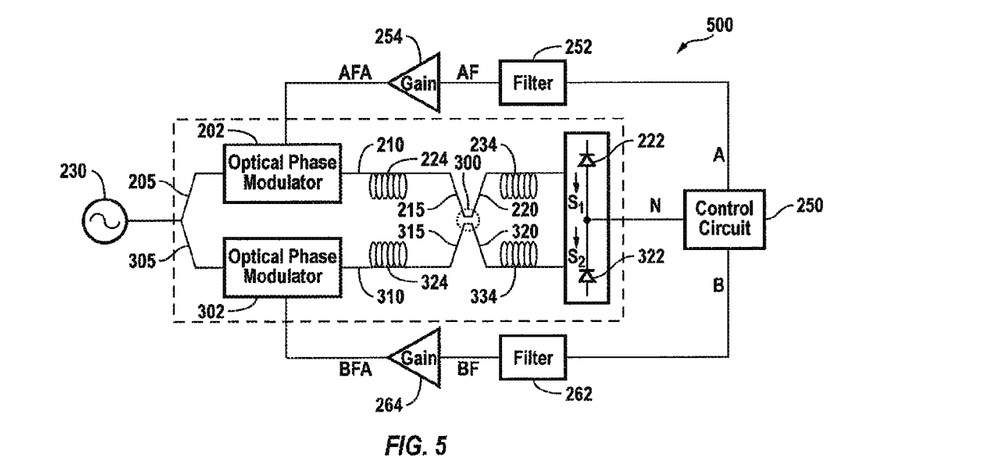
FIG. 5 is a simplified block diagram of an opto-electronic oscillator, in accordance with one embodiment of the present invention.

FIG. 5 is a simplified block diagram of an opto-electronic oscillator 500, in accordance with another embodiment of the present invention. Opto-electronic oscillator 500 is similar to opto-electronic oscillator 200 of FIG. 2 except that opto-electronic oscillator 500 has disposed therein a delay line in each of the two paths leading to the coupler, namely delay lines 224, 234, as well as a delay line in each of the two paths leading to the optical-to-electrical conversion circuit 225, namely delay lines 234, 334. In one embodiment, the sum of the delays across delay lines 224 and 234 is similar to the sum of delays across the delay lines 324 and 334.

Figure 6:
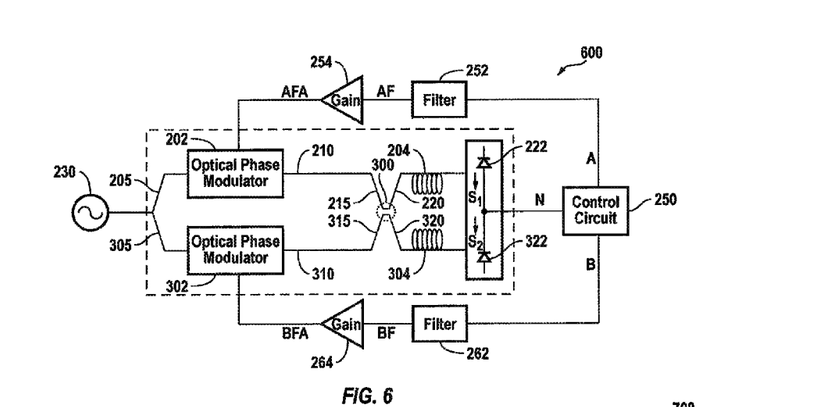
FIG. 6 is a simplified block diagram of an opto-electronic oscillator, in accordance with one embodiment of the present invention.

FIG. 6 is a simplified block diagram of an opto-electronic oscillator 600, in accordance with another embodiment of the present invention. Opto-electronic oscillator 600 is similar to opto-electronic oscillator 200 of FIG. 2 except that in opto-electronic oscillator 600, delay lines 204 and 304 are disposed in optical paths 220 and 320 respectively between coupler 300 and optical-to-electrical conversion circuit 225.

Figure 7:
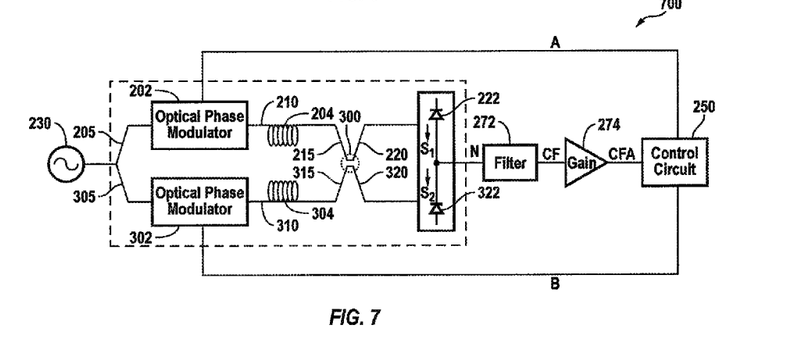
FIG. 7 is a simplified block diagram of an opto-electronic oscillator, in accordance with one embodiment of the present invention.

FIG. 7 is a simplified block diagram of an opto-electronic oscillator 700, in accordance with another embodiment of the present invention. Opto-electronic oscillator 700 is similar to opto-electronic oscillator 200 of FIG. 2 except that opto-electronic oscillator 700 includes a filter 272 and a amplification stage 274 disposed between the output node N of optical-to-electrical signal conversion circuit and control circuit 250. Output signal A of control circuit 250 is a first feedback signal applied to optical phase modulator 202, and output signal B of control circuit 250 is a second feedback signal applied to optical phase modulator 302.

Figure 8:
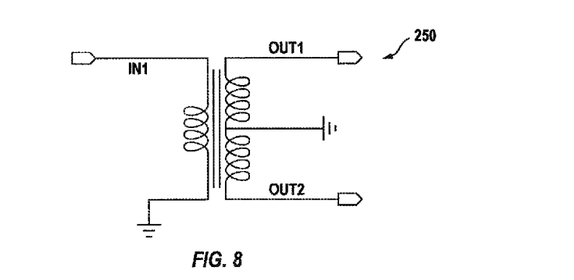
FIG. 8 is a simplified block diagram of an exemplary control circuit disposed in an opto-electronic oscillator, in accordance with one embodiment of the present invention.

FIG. 8 is a simplified block diagram of control circuit 250 shown as having an input terminal $IN_1$ and a pair of differential output terminals $OUT_1$ and $OUT_2$ that are complements of one another. For example, referring to FIGS. 3 and 8 concurrently, if optical-to-electrical signal conversion circuit 225 is supplying a current to node N, then output signals A and B are out-of phase. In one embodiment, control circuit 50 is a Balun.

Referring to FIG. 3, in one embodiment, the optical phase modulators, delay lines, the coupler and the optical-to-electrical signal conversion circuit are formed in a first semiconductor substrate. In such embodiments, control circuit 250, filters and amplification stages may be discrete devices or may be formed in a second semiconductor substrate. In yet other embodiments, all the components shown in FIG. 3 including, phase modulators, optical delay lines, the coupler, the optical-to-electrical signal conversion circuit, the control circuit, filters and amplification stages are formed in the same semiconductor substrate.

Figure 9:
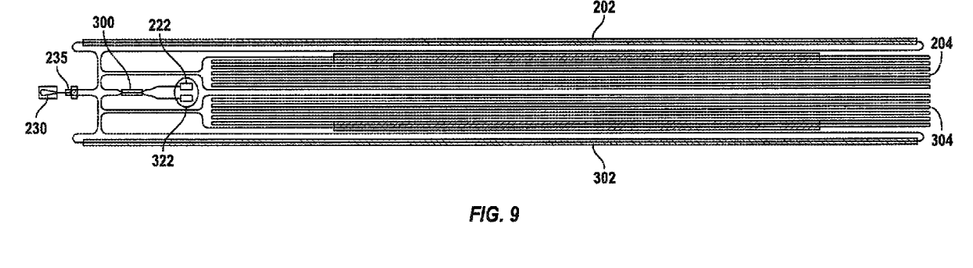
FIG. 9 is a top schematic view of a layout of the opt-electronic oscillator of FIG. 3, in accordance with one embodiment of the present invention.

FIG. 9 is a top schematic view of a layout of the opt-electronic oscillator 200 of FIG. 3, in accordance with one embodiment of the present invention. Optical signal entering through grating coupler 230 is shows as being split by signal splitter 235 and delivered to optical phase modulators 202, 204. The outputs of the phase modulators 202, 204 are shown as being received by delay lines 204, 304 and delivered to coupler 300. The output signals of coupler 300 are in turn shown as being applied to photodiodes 202, 204—which together form an optical-to-electrical signal conversions circuit. The control circuit and the feedback loops controlling the phase modulators are not shown in FIG. 9.

The above embodiments of the present invention are illustrative and not limitative. Embodiments of the present invention are not limited by the wavelength frequency of the optical source, the type of phase modulator, delay line, signal splitter, signal coupler, optical-to-electrical signal conversion (that may be photodiodes or otherwise), control circuit, filter or amplifier used in the opto-electronic oscillator. Embodiments of the present invention are not limited by the type of substrate, semiconductor or otherwise, in which various optical and electrical components of the opto-electronic oscillator are formed. Other additions, subtractions or modifications are obvious in view of the present disclosure and are intended to fall within the scope of the appended claims.

What is claimed is:

1. An opto-electrical oscillator comprising:
    a first optical phase modulator adapted to modulate a phase of a first optical signal in response to a first feedback signal to generate a first phase modulated signal, said first optical signal travelling through a first optical path;
    a second optical phase modulator adapted to modulate the phase of a second optical signal in response to a second feedback signal to generate a second phase modulated signal, said second optical signal travelling through a second optical path;
    a coupler having first and second input ports adapted to receive the first and second phase modulated signals, said coupler, in response, supplying a first optical output signal from it first output port and a second optical output signal from its second output port, said first and second optical output signals forming a pair of differential optical signals;
    a first optical-to-electrical signal converter adapted to receive the first optical output signal of the coupler;
    a second optical-to-electrical signal converter adapted to receive the second optical output signal of the coupler;
    a control circuit adapted to cause the first and second feedback signals to be out of phase in response to an output signal of the first and second optical-to-electrical signal converters;
    a first filter responsive to a first output terminal of the control circuit;
    a first amplification stage generating the first feedback signal in response to the first filter;
    a second filter responsive to a second output terminal of the control circuit; and
    a second amplification stage generating the second feedback signal in response to the second filter.

2. The opto-electrical oscillator of claim 1 further comprising:
    a first optical delay line coupled between the first optical phase modulator and the coupler; and
    a second optical delay line coupled between the second optical phase modulator and the coupler.

3. The opto-electrical oscillator of claim 2 wherein said first and second optical delay line provide a similar delay.

4. The opto-electrical oscillator of claim 1 further comprising:
    a first optical delay line coupled between the first optical-to-electrical converter and the coupler; and
    a second optical delay line coupled between the second optical-to-electrical converter and the coupler.

5. The opto-electrical oscillator of claim 1 further comprising:
    a first optical delay line coupled between the first optical phase modulator and the coupler;
    a second optical delay line coupled between the second optical phase modulator and the coupler;
    a third optical delay line coupled between the first optical-to-electrical signal converter and the coupler; and
    a fourth optical delay line coupled between the second optical-to-electrical signal converter and the coupler.

6. The opto-electrical oscillator of claim 1 further comprising:
    a filter responsive to output signals of the first and second optical-to-electrical signal converters; and
    an amplification stage amplifying an output signal of the filter, said control circuit supplying the first and second feedback signals in response to the amplified output signal of the amplifier.

7. The opto-electrical oscillator of claim 1 wherein said control circuit is a single-ended to a differential pair signal converter.

8. The opto-electrical oscillator of claim 7, wherein said single-ended to a differential pair signal converter is a Balun.

9. The opto-electrical oscillator of claim 1 wherein said control circuit is further adapted to cause the first and second feedback signals to be out of phase by substantially 180 degrees.

10. A method of generating and oscillating signal, the method comprising:
    modulating a phase of a first optical signal in response to a first feedback signal to generate a first phase modulated signal, said first optical signal travelling through a first optical path;
    modulating a phase of a second optical signal in response to a second feedback signal to generate a second phase modulated signal, said second optical signal travelling through a second optical path;
    supplying the first and second phase modulated signals to a coupler generating a first optical output signal from its first output port and a second optical output signal from its second output port, said first and second optical output signals forming a pair of differential optical output signals;

converting the first optical output signal of the coupler to a first electrical signal;

converting the second optical output signal of the coupler to a second electrical signal;

combining the first and second electrical signals to generate a combined electrical signal;

causing the first and second feedback signals to be out of phase in response to the combined electrical signal;

filtering a first signal generated in response to the combined electrical signal;

amplifying the first filtered signal to generate the first feedback signal;

filtering a second signal generated in response to the combined electrical signal; and amplifying the second filtered signal to generate the second feedback signal.

11. The method of claim 10 further comprising:
delaying the first phase modulated optical signal; and
delaying the second phase modulated optical signal.

12. The method of claim 11 wherein the delays of the first and second modulated signals are substantially similar.

13. The method of claim 10 further comprising:
delaying the first and second optical output signals of the coupler.

14. The method of claim 10 further comprising:
delaying the first phase modulated optical signal;
delaying the second phase modulated optical signal; and
delaying the first and second optical output signals of the coupler.

15. The method of claim 10 further comprising:
filtering the electrical signal to generate a filtered signal; and
generating the first and second feedback in response to the filtered signal.

16. The method of claim 10 further comprising:
converting the combined electrical signal to a pair of differential signals.

17. The method of claim 16 further comprising:
converting the combined electrical signal to a pair of differential signals using a Balun.

18. The method of claim 10 further comprising:
causing the first and second feedback signals to be out of phase by substantially 180 degrees.

19. The opto-electrical oscillator of claim 1 wherein said opto-electrical oscillator is formed in a semiconductor substrate.

* * * * *